United States Patent [19]
Mitsui et al.

[11] Patent Number: 5,760,457
[45] Date of Patent: Jun. 2, 1998

[54] BIPOLAR TRANSISTOR CIRCUIT ELEMENT HAVING BASE BALLASTING RESISTOR

[75] Inventors: Shigeru Mitsui; Takuji Sonoda; Teruyuki Shimura; Saburo Takamiya, all of Hyogo, Japan

[73] Assignee: Mitsubishi Denki Kabushiki Kaisha, Tokyo, Japan

[21] Appl. No.: 806,396

[22] Filed: Feb. 26, 1997

Related U.S. Application Data

[63] Continuation of Ser. No. 530,090, Sep. 19, 1995, abandoned.

[30] Foreign Application Priority Data

Apr. 7, 1995 [JP] Japan ................. 7-083011

[51] Int. Cl.$^6$ ................. H01L 29/00; H01L 31/0328
[52] U.S. Cl. ................. 257/582; 257/580; 257/197; 257/201; 257/581; 257/532; 257/536; 257/539; 257/583
[58] Field of Search ................. 257/580, 582, 257/197, 201, 581, 532, 536, 539, 583

[56] References Cited

U.S. PATENT DOCUMENTS

| | | | |
|---|---|---|---|
| 5,321,279 | 6/1994 | Khatibzadeh et al. | 257/197 |
| 5,373,170 | 12/1994 | Pfiester et al. | 257/68 |
| 5,506,427 | 4/1996 | Imai | 257/197 |
| 5,532,486 | 7/1996 | Stanchina et al. | 257/472 |

FOREIGN PATENT DOCUMENTS

| | | | |
|---|---|---|---|
| 0546919 | 6/1993 | European Pat. Off. | |
| 2726125 | 4/1996 | France | |
| 56-74959 | 6/1981 | Japan | 257/539 |
| A01140667A | 6/1989 | Japan | 257/583 |
| 3248535 | 11/1991 | Japan | |

*Primary Examiner*—Wael Fahmy
*Assistant Examiner*—Fetsum Abraham
*Attorney, Agent, or Firm*—Leydig, Voit & Mayer, Ltd.

[57] ABSTRACT

A bipolar transistor circuit element includes a semiconductor substrate; successively disposed on the substrate, a base layer, an emitter layer, and a collector layer; a bipolar transistor formed from parts of the collector, base, and emitter layers and including a base electrode electrically connected to the base layer and a base electrode pad for making an external connection to the base layer; a base ballasting resistor formed from a part of the base layer isolated from the bipolar transistor and electrically connecting the base electrode to the base electrode pad; and a base parallel capacitor connected in parallel with the base ballasting resistor wherein the base parallel capacitor includes part of the base input pad, a dielectric film disposed on part of the base electrode pad, and a second electrode disposed on the dielectric layer opposite the base electrode pad and electrically connected to the emitter electrode of the bipolar transistor. The base ballasting resistor has a high resistance relative to an emitter ballasting reactor so that it can be easily mass produced with good uniformity and yield.

17 Claims, 4 Drawing Sheets

5,760,457

BIPOLAR TRANSISTOR CIRCUIT ELEMENT HAVING BASE BALLASTING RESISTOR

This disclosure is a continuation of patent application Ser. No. 08/530.090, filed Sep. 19, 1995 now abandoned.

FIELD OF THE INVENTION

The present invention relates to a bipolar transistor circuit element that includes a bipolar transistor that may be a heterojunction bipolar transistor (HBT).

BACKGROUND OF THE INVENTION

In a bipolar transistor there is a positive feedback relationship between collector current and the temperature of the transistor. In a bipolar transistor including a plurality of emitter fingers, the emitter fingers operate at different temperatures, i.e., have a non-uniform temperature distribution, due to self-heating that is related to the current that a particular emitter finger carries. Because of the temperature distribution among the emitter fingers, some emitter fingers are warmer than other emitter fingers. Since warmer emitter fingers carry more current than cooler emitter fingers, there can be increasing concentration of current flow through a few or even a single emitter finger as the temperatures of emitter fingers change. Because of this self-heating effect, it is not possible to divide a collector current uniformly among a plurality of emitter fingers in a transistor with more than one emitter finger. Concentration of current within a few of the emitter fingers of a transistor can result in thermal runaway and destruction of the transistor.

To prevent thermal runaway, conventional bipolar transistor circuit elements include an emitter ballasting resistor connected in series with the emitter of a bipolar transistor. The emitter ballasting resistor reduces the thermal resistance of the circuit element and provides some automatic control against thermal runaway. In this bipolar transistor circuit element, the emitter-base junction voltage, which determines the collector current, is automatically controlled in response to the voltage drop across the emitter ballasting resistor because of the flow of the emitter current through that emitter ballasting resistor.

FIG. 8 schematically shows a conventional bipolar transistor circuit element including an emitter ballasting resistor. The emitter ballasting resistor may be a thin film resistor mounted on a semiconductor substrate including the bipolar transistor, a resistance in the substrate prepared, for example, by ion implantation, a constant resistance between the emitter layer and an ohmic contact through the substrate, or an epitaxial layer of one semiconductor material disposed on an emitter layer of a different semiconductor material. The thermal resistance of the circuit element may be reduced by dissipating heat through an emitter electrode as well as from a surface of the semiconductor substrate including the bipolar transistor.

In the conventional bipolar transistor circuit element the ballasting resistor is connected to the emitter of the bipolar transistor to control the emitter-base junction voltage. However, that connection generally increases the thermal resistance of the circuit element so that it is desirable to further reduce that thermal resistance. In addition, when the resistance of the emitter ballasting resistor is too large, the RF power gain of the transistor is undesirably reduced. In order to avoid undue thermal resistance and reduction in RF power gain, the emitter ballasting resistor usually has a relatively low resistance, for example lower than 10 ohms. However, reliable mass production of a resistor having such a low resistance without significant resistance variations is very difficult.

SUMMARY OF THE INVENTION

The present invention has as one of its objects providing a bipolar transistor circuit element that can be reliably manufactured without wide variation in electrical characteristics, in which RF gain is not unduly reduced, and in which heat dissipation from an emitter electrode of the bipolar transistor is not disturbed.

Secondly to one aspect of the invention, a bipolar transistor circuit element includes a semiconductor substrate; successively disposed on the substrate, a base layer, an emitter layer, and a collector layer; a bipolar transistor formed from parts of the collector, base, and emitter layers and including a base electrode electrically connected to the base layer and a base electrode pad for making an external connection to the base layer; a base ballasting resistor formed from a part of the base layer isolated from the bipolar transistor and electrically connecting the base electrode to the base electrode pad; and a base parallel capacitor connected in parallel with the base ballasting resistor wherein the base parallel capacitor includes part of the base input pad, a dielectric film disposed on part of the base electrode pad, and a second electrode disposed on the dielectric layer opposite part of the base electrode pad and electrically connected to the base electrode of the bipolar transistor.

According to another aspect of the invention, a bipolar transistor circuit element includes a semiconductor substrate; successively disposed on the substrate, a base layer, an emitter layer, and a collector layer; a bipolar transistor formed from parts of the collector, base, and emitter layers and including a base electrode electrically connected to the base layer and a base electrode pad for making an external connection to the base layer; a base ballasting resistor formed from a part of the base layer isolated from the bipolar transistor and electrically connecting the base electrode to the base electrode pad; and a base parallel capacitor connected in parallel with the base ballasting resistor wherein the base parallel capacitor includes parts of the base and emitter layers isolated from the bipolar transistor and an electrode electrically contacting the part of the emitter layer included in the capacitor and electrically connected to the base input pad.

The invention is described below with respect to certain preferred embodiments in conjunction with the drawing figures. Various modifications and additions to the described embodiments within the spirit of the invention will occur to those of skill in the art. The invention encompasses all such modifications, additions, and equivalents of them. The scope of the invention is defined by the claims following the detailed description.

BRIEF DESCRIPTION OF DRAWINGS

In all figures the same elements are given the same reference numbers.

DETAILED DESCRIPTION OF PREFERRED EMBODIMENTS

Figure 1:
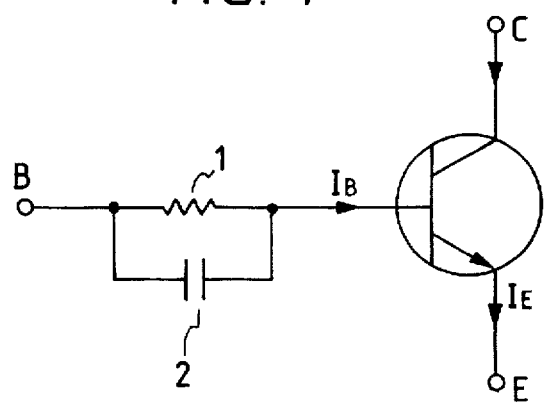
FIG. 1 is a schematic diagram of a bipolar transistor circuit element according to an embodiment of the invention.

FIG. 1 is a schematic diagram of a bipolar transistor element according to an embodiment of the invention. The bipolar transistor may be an HBT or a conventional bipolar transistor. The circuit element of FIG. 1 includes a base ballasting resistor 1 electrically connected to the base B of the transistor. That transistor includes a collector C and an emitter E. A base parallel capacitor 2 is connected in parallel with the base ballasting resistor 1.

In the prior art transistor element, the emitter ballasting resistor has a typical resistance of 7 ohms. If, in the transistor of FIG. 1, the base current is $I_B$ and the emitter current is $I_E$, the resistance $R_B$ of the base ballasting resistor 1 can be determined from the following equation in order to produce a voltage drop equivalent to the voltage drop produced by the conventional 7-ohm emitter ballasting resistor.

$$R_B I_B = 7 I_E$$

Assuming that the gain of the transistor is 40, i.e., $I_E/I_B=40$, the base ballasting resistor should have a resistance of 280 ohms to provide the same effect as the 7-ohm emitter ballasting resistor of the prior art structure. Since the base ballasting resistor is much larger than the conventional emitter ballasting resistor, it is more easily produced and is easily reproduced from circuit element to circuit element.

RF loss in a bipolar circuit element according to the invention is determined by the real part of $R_B/(1+j\omega C_B R_B)$, where $C_B$ is the capacitance of the base parallel capacitor 2, $\omega$ is the angular frequency, and $j^2$ is $-1$. At 12 GHz, when $R_B$ is 280 ohms and $C_B$ is 300 pF, the real part of the formula is approximately 7 ohms. In other words, at 12 GHz, when the base ballasting resistor is 280 ohms and the base parallel capacitance is 300 pF, the operating conditions achieved are the same as when an emitter ballasting resistor having a resistance of 7 ohms is connected to the emitter of the bipolar transistor in the bipolar transistor circuit element. If the capacitance of the base parallel capacitor is increased, the RF loss is decreased.

Figure 2A:
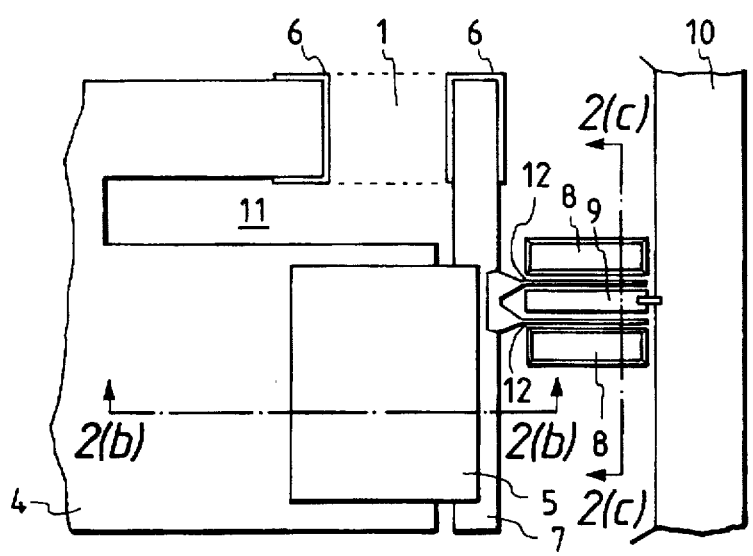
FIG. 2 (a) is a plan view and FIGS. 2(b) and 2(c) are sectional views taken along lines 2b—2b and 2c—2c of FIG. 2(a), respectively, of an HBT circuit element according to an embodiment of the invention.
Figure 2C:
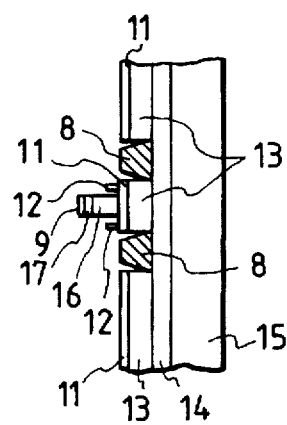
Figure 2B:
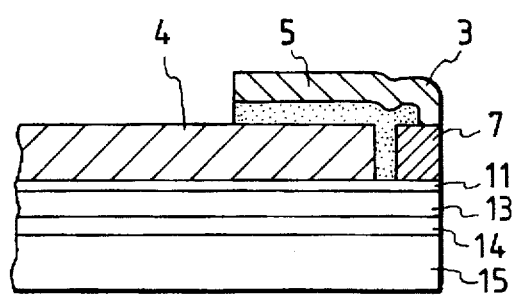

The optimum design of a bipolar transistor circuit element according the invention requires consideration of the area of the semiconductor substrate occupied by the transistor. FIGS. 2(a), 2(b), and 2(c) are plan and sectional views of a heterojunction n-p-n bipolar transistor circuit element in accordance with an embodiment of the invention.

FIGS. 2(a), 2(b), and 2(c) show a bipolar transistor circuit element of that is understood to be part of a much larger transistor. FIG. 2(c) shows a transistor circuit element including a single emitter finger and associated base ballasting resistor and base parallel capacitor. In a typical high frequency transistor device, ten or twenty emitter fingers are present. The structure includes ten or more sections like the elementary section shown in FIG. 2(a). All the sections are connected in parallel to increase power output, and are typically disposed along a straight line. Referring to FIG. 2(a) the emitter electrode pad 10 typically extends along and interconnects the emitters of the transistor device. FIGS. 3–6 concern devices with ten and twenty emitter fingers, i.e., elements of the type shown in FIG. 2(a), electrically connected in parallel.

The bipolar circuit element of FIGS. 2(a), 2(b), and 2(c) includes a base ballasting resistor 1. A parallel base capacitor includes a SiN film 3 disposed between a base input pad 4 and a first capacitor electrode 5. The structure also includes a base input electrode 7, collector electrodes 8, and an emitter electrode 9, an emitter electrode pad 10 electrically connected to the emitter electrode 9, a p-type GaAs base layer 11, and base electrodes 12 connected to the base pad 4 of the transistor through the base input electrode 7, the base ballasting resistor 1 and the base parallel capacitor 2. An n-type GaAs collector layer 13 is disposed on an $n^+$-type GaAs collector contact layer 14, which, in turn, is disposed on a semi-insulating GaAs substrate 15. An n-type AlGaAs emitter layer 16 is disposed on a part of the base layer 11 as an emitter finger and is in contact with an $n^+$-type InGaAs emitter contact layer 17. The emitter electrode 9 connects the emitter contact layer 17 to the emitter electrode pad 10.

In this embodiment, the base ballasting resistor 1 is a sheet resistor that is a part of the base layer 11 that is not covered by either the contact layer 17 or the emitter layer 16 and is isolated from the bipolar transistor. The base ballasting resistor 6 is that part of the base layer 11 lying between a first ohmic contact, i.e., a first resistor electrode 6, on part of the base input pad 4 and a second ohmic contact, i.e., a second resister electrode 6, on part of the base input electrode 7. The two electrodes 6 confront each other, defining edges of the sheet resistor part of the base layer 11. That base ballasting resistor 1 is connected in parallel with an metal/insulator/metal (MIM) capacitor including the SiN film 3, the base input pad 4, and the first capacitor electrode 5. The parallel electrical connections of the base ballasting resistor 1 and the base parallel capacitor are made through the base input pad 4 and the base input electrode 7, respectively.

In this embodiment, the base layer 11 has a thickness of 70 nanometers (nm), a majority charge carrier concentration of $4\times10^{19}$ cm$^3$, and a sheet resistance of approximately 280 ohms/square. The base ballasting resistor resistance of 280 ohms is obtained by controlling the spacing between the first and second resistor electrodes 6 shown in FIG. 2(a) to be the same as the length of those electrodes. For example, those dimensions may each be 20 micrometers as indicated by the broken lines shown in FIG. 2(a). A parallel base capacitance of 300 pF is likewise easily achieved by controlling the dimensions of the capacitor plates and the dielectric film between them. The relative dielectric constant of the SiN film 3 is 7. The SiN film 3 should be 50 nm thick if the area of the MIM capacitor is 240 square micrometers, i.e., 20×12 square micrometers, so that the capacitance of the MIM capacitor at 12 GHz is 300 pF, as desired. The capacitance of the MIM capacitor is easily controlled by controlling the thickness of the SiN film 3 and its area. The potential across the capacitor is determined by the voltage difference between the base input electrode 7 and the base input pad 4.

Figure 3:
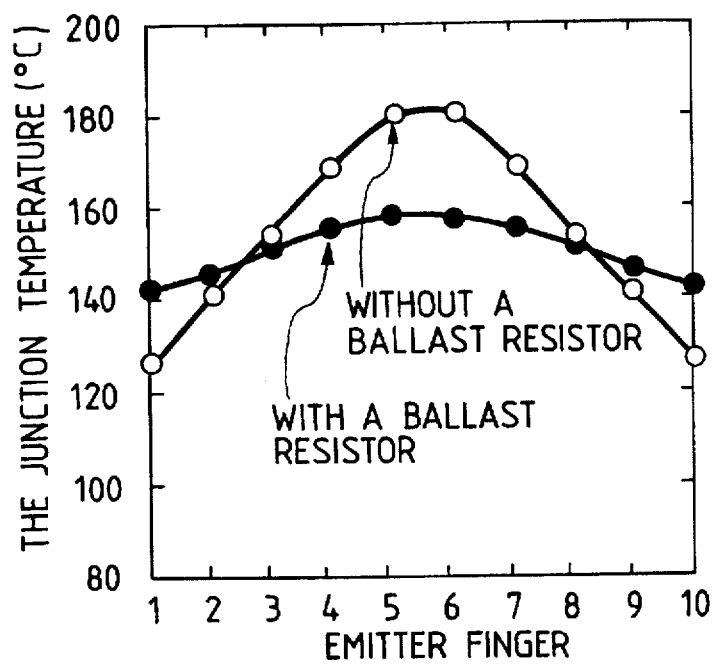
FIG. 3 is a graph of temperature distributions of emitter fingers in an HBT circuit element according to an embodiment of the invention and in a similar HBT without a ballasting resistor.
Figure 4:
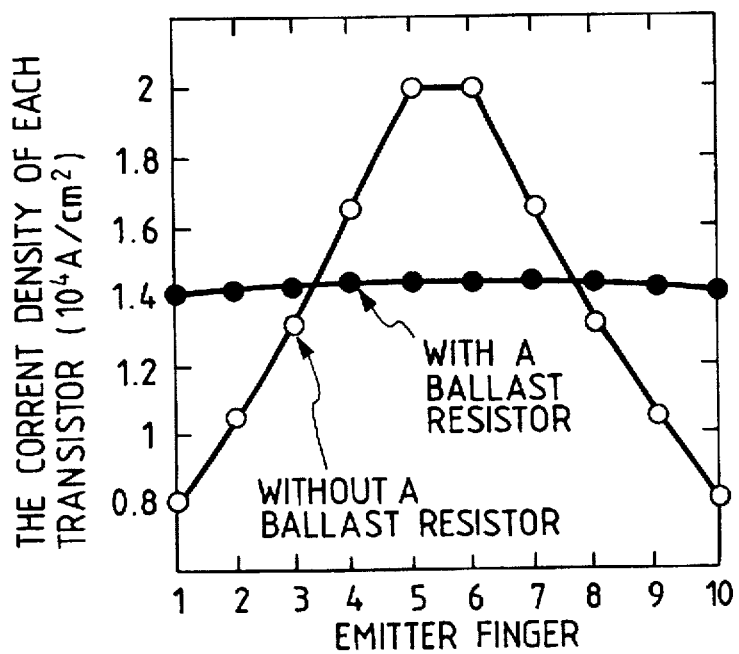
FIG. 4 is a graph of current density distributions of emitter fingers in an HBT circuit element according to an embodiment of the invention and a similar HBT without a ballasting resistor.

FIGS. 3 and 4 are graphs of respective comparisons of the distributions of temperature and current density for bipolar transistors including ten emitter fingers, with each finger having dimensions of 2×20 square micrometers, for an AlGaAs/GaAs HBT. The line with the solid circles in each of the figures represents the distribution for a transistor circuit element according to an embodiment of the invention and the line with the open circles represents the results for a transistor circuit element including no ballasting resistor. These transistor circuit elements have structures similar to those shown in FIGS. 2(a), 2(b), and 2(c), repeated ten times to provide ten emitter fingers. No ballasting resistor or base parallel capacitance is present for the comparative bipolar transistor circuit element.

It is apparent from FIG. 3 that the temperature of the central emitter fingers, i.e., fingers 4–7, for the circuit element lacking a ballasting resistor is significantly higher than the temperature of the other emitter fingers in that circuit element. A temperature variation of about 55° C. is observed. By contrast, in an embodiment of the invention, the temperature of all of the emitter fingers is essentially the same with a variation of no more than about 15° C. The hottest emitter finger is about 25° C. cooler than the hottest emitter finger in the conventional circuit element.

FIG. 4 shows that the current distribution across the emitter fingers of a transistor circuit element without a ballasting resistor has a widely varying current density, varying by a factor of 2.5 between the outermost emitter fingers and the central emitter fingers. By contrast, in the embodiment of the invention represented by the line with solid circles, there is almost no variation in current density flowing through the emitter fingers. In other words, the collector current is almost equally divided among the ten emitter fingers of the bipolar transistor circuit element according to the invention. Since very uniform distributions of temperature and collector current are achieved in a transistor circuit element according to the invention, that circuit element can be operated at higher power than a comparable prior art transistor without risk of overheating the transistor or thermal runaway. Similar results are obtained in structures including twenty emitter fingers.

Figure 5:
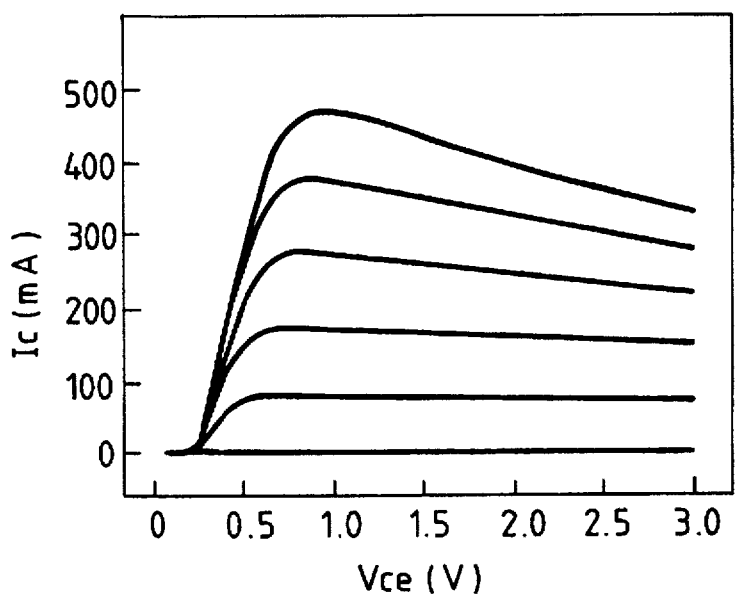
FIG. 5 is an I-V characteristic of an HBT circuit element according to an embodiment of the present invention.
Figure 6:
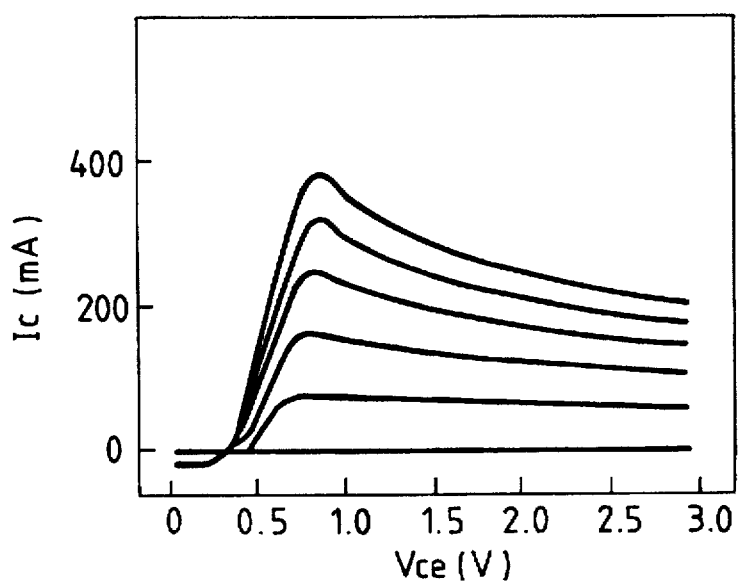
FIG. 6 is an I-V characteristic of an HBT without a ballasting resistor.

Voltage current characteristics of an HBT with a base ballasting resistor according to an embodiment of the invention and including twenty emitter fingers is shown in FIG. 5. An I-V characteristic for an HBT having the same structure as the transistor circuit element of FIG. 5, but omitting the base ballasting resistor, is shown in FIG. 6. Those graphs demonstrate that a far more uniform I-V characteristic without a pronounced peak is achieved in a transistor circuit element according to the invention than in the conventional transistor. Moreover, the collector current is approximately 1.25 times higher in the HBT according to the invention as compared to the similar HBT without any base ballasting resistor.

In this embodiment, the base ballasting resistor is a sheet resistor that has a resistance that is larger than the emitter ballasting resistor of the prior art structure by a factor equal to the current gain of the transistor. Therefore, this base ballasting resistor can be repeatedly made with good yield and uniform resistance without unusual variations when a large number of transistor circuit elements according to the invention are manufactured. In this embodiment, the parallel capacitance is a MIM capacitor that prevents reductions in RF power gain and power losses that can occur when a base ballasting resistor is employed with a bipolar transistor as in the invention. The combination of the base ballasting resistor and the parallel capacitor provide the same performance as the prior art structure including an HBT having an emitter ballasting resistor with a resistance of 7 ohms.

Although the specific embodiment described includes an AlGaAs/GaAs HBT with a p-type GaAs base layer and an AlGaAs emitter layer, the invention is also applicable to a silicon bipolar transistor and to silicon HBTs in which the base layer is an alloy of SiGe, another semiconductor material including silicon, or a III-V compound semiconductor including indium.

Figure 7A:
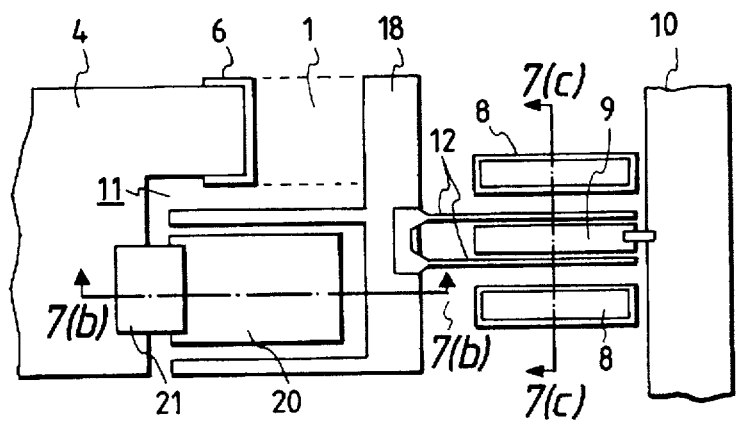
FIG. 7(a) is a plan view and FIGS. 7(b) and 7(c) are sectional views taken along lines 7b—7b and 7c—7c of FIG. 7(a), respectively, of an HBT circuit element according to an embodiment of the invention.
Figure 7C:
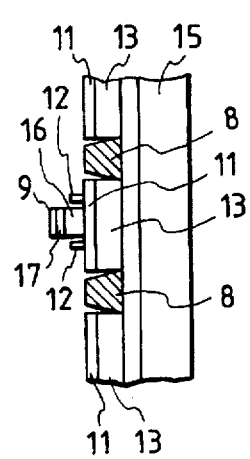
Figure 7B:
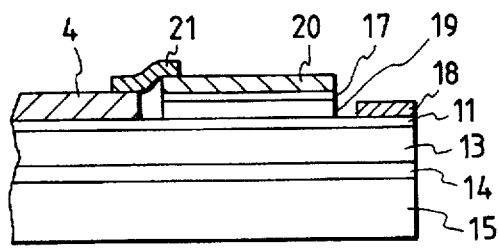
Figure 8:
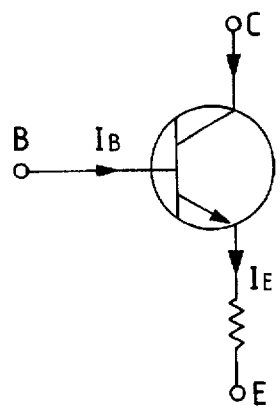
FIG. 8 is a schematic diagram of a conventional bipolar transistor with an emitter ballasting resistor.

FIGS. 7(a), 7(b), and 7(c) are a plan view and two sectional views of a GaAs/AlGaAs n-p-n HBT according to a second embodiment of the invention. As in the first embodiment, the illustrated structure includes only a single emitter finger but is part of a larger structure including multiples of the unit illustrated in FIG. 7(a). In this embodiment, the base parallel capacitance 2 is not an MIM capacitor but is a capacitor formed of parts of the emitter layer and the base layer that are isolated from the base and emitter of the bipolar transistor. The base and emitter of the transistor use other parts of those two layers.

As in the first embodiment, in FIG. 7(a) a base ballasting resistor 1 is formed of part of the base layer 11 from which the InGaAs contact layer 17 and the AlGaAs emitter layer 16 have been removed. As in the first embodiment, this resistor in the base layer has a resistance of 280 ohms. As in the first embodiment, the broken lines in FIG. 7 indicate the area of the base layer 11 that functions as the base ballasting resistor 1. In the structure of FIG. 7(a), a resistor electrode 6 provides one contact to the base ballasting resistor 1 and a base electrode 18 provides the other contact to that base ballasting resistor 1. The base input electrode 18 connects the base ballasting resistor 1 to one contact of the base parallel capacitor, i.e., the base layer 11. That capacitor includes part of the p-type GaAs base layer 11 and part of the n-type AlGaAs emitter layer 19 contacting the base layer 11. The second contact to the base parallel capacitor is made through the n$^+$-type InGaAs contact layer 17 and a capacitor electrode 20 on the contact layer 17 that is isolated from the bipolar transistor and connected by a metalization 21 to the base input pad 4. That part of the emitter electrode layer is isolated from the emitter finger of the transistor. As can be seen from FIG. 7(a), this arrangement of electrodes provides a parallel electrical connection of the base ballasting resistor and the base parallel capacitance.

As in the first embodiment, the resistance of the base ballasting resistor is determined by controlling the spacing between the resistor electrode 6 and the base electrode 18 as well as the width of the resistor electrode 6. For example, each of those dimensions may be 20 micrometers. The capacitance of the base parallel capacitor is determined by controlling the area of the capacitance electrode 20. Assuming that the n-type emitter layer 16 is $Al_{0.3}Ga_{0.7}As$ and that the majority charge carrier concentration is $5 \times 10^{17} cm^{-3}$, and that the majority charge carrier concentration of the p-type GaAs base layer 11 is $4 \times 10^{19}$ $cm^{-3}$, then the depth of a depletion region in the base layer 11 is negligible as compared to the depth of a depletion region in the emitter layer 19. The depletion region depth in the emitter layer is about 60 nm when the voltage between the emitter and the base is zero. In this condition, the junction capacitance between the emitter and base layers is 1.9 pF per square micrometer. By selecting the area of the capacitance electrode 20 to be about 150 square micrometers, the capacitance is 300 pF. Of course, as a forward bias voltage is applied across the capacitor, the depths of the depletion layers are reduced, increasing the capacitance. Likewise, the capacitance is decreased when a reverse bias voltage is applied across the capacitor. Therefore, there may be some variation in the capacitance because, even if a DC forward bias is applied to the capacitor, an RF signal that is applied to the base layer and amplified by the transistor circuit element varies in amplitude.

As in the first embodiment, the second embodiment of the transistor circuit element may be applied to a bipolar transistor made entirely of silicon or a heterojunction bipolar transistor including silicon and a base layer of an alloy of silicon and germanium, another semiconductor material including silicon, or a III-V compound semiconductor material including indium. The invention also includes bipolar transistors employing other semiconductor materials. As in the first embodiment, in the second embodiment, since the base ballasting resistor has a relatively large resistance, it can be reproducibly manufactured with high yield.

Since in the present invention the ballasting resistor is connected to the base electrode of the transistor of the circuit element, the thermal resistance of the circuit element is reduced without interfering with heat dissipation from the emitter electrode. Because of the presence and connection of the base parallel capacitor to the base ballasting resistor, reductions in RF power gain are suppressed and stable operation of the bipolar transistor circuit element at high frequencies is achieved.

We claim:

1. A bipolar transistor circuit element comprising:
   a semiconductor substrate;
   successively disposed on the substrate in mutually electrically and physically isolated first and second areas of the substrate, a collector layer and a base layer;
   an emitter layer disposed on the base layer in the first area but not in the second area, the emitter layer, the base layer, and the collector layer forming a bipolar transistor in the first area of the substrate;
   a base electrode electrically connected to the base layer in the first area of the substrate;
   a base electrode pad for making an external connection to the base layer in the first area of the substrate;
   a base ballasting resistor including the base layer in the second area of the substrate as a resistance element, the base ballasting resistor electrically connecting the base electrode to the base electrode pad; and
   a base parallel capacitor connected in parallel with the base ballasting resistor wherein the base parallel capacitor includes part of the base electrode pad, a dielectric film disposed on part of the base electrode pad, and a second electrode disposed on the dielectric layer opposite part of the base electrode pad and electrically connected to the base electrode of the bipolar transistor.

2. The bipolar transistor circuit element of claim 1 where the emitter layer and the base layer are different semiconductor materials.

3. The bipolar transistor circuit element of claim 2 wherein the emitter layer is AlGaAs and the base layer is GaAs.

4. The bipolar transistor circuit element of claim 2 wherein the emitter layer is Si and the base layer is SiGe.

5. The bipolar transistor circuit element of claim 2 wherein the base layer is a III-V compound semiconductor including indium.

6. The bipolar transistor circuit element of claim 1 wherein the emitter layer and the base layer are the same semiconductor material.

7. The bipolar transistor circuit element of claim 1 including an emitter contact layer disposed on the emitter layer.

8. The bipolar transistor circuit element of claim 1 including a collector contacting layer disposed between the collector layer and the semiconductor substrate.

9. The bipolar transistor circuit element of claim 8 wherein the dielectric layer is SiN.

10. A bipolar transistor circuit element comprising:
    a semiconductor substrate;
    successively disposed on the substrate in mutually electrically and physically isolated first, second, and third areas of the substrate, a collector layer and a base layer;
    an emitter layer disposed on the base layer in the first and second areas of the substrate but not on the base layer in the third area of the substrate, the collector layer, base layer, and emitter layer forming a bipolar transistor in the first area of the substrate;
    a base electrode electrically connected to the base layer in the first area of the substrate;
    a base electrode pad for making an external connection to the base layer in the first area of the substrate;
    a base ballasting resistor including the base layer in the third area of the substrate as a resistance element, the base ballasting resistor electrically connecting the base electrode to the base electrode pad; and
    a base parallel capacitor connected in parallel with the base ballasting resistor, the base parallel capacitor including the base and emitter layers in the second area of the substrate, and a connecting electrode electrically contacting the emitter layer in the second area of the substrate and included in the capacitor, the connecting electrode being electrically connected to the base electrode pad.

11. The bipolar transistor circuit element of claim 10 where the emitter layer and the base layer are different semiconductor materials.

12. The bipolar transistor circuit element of claim 11 wherein the emitter layer is AlGaAs and the base layer is GaAs.

13. The bipolar transistor circuit element of claim 11 wherein the emitter layer is Si and the base layer is SiGe.

14. The bipolar transistor circuit element of claim 11 wherein the base layer is a III-V compound semiconductor including indium.

15. The bipolar transistor circuit element of claim 10 wherein the emitter layer and the base layer are the same semiconductor material.

16. The bipolar transistor circuit element of claim 10 including an emitter contact layer disposed on the emitter layer.

17. The bipolar transistor circuit element of claim 10 including a collector contacting layer disposed between the collector layer and the semiconductor substrate.

* * * * *